US006955241B2

(12) United States Patent
Thorsell et al.

(10) Patent No.: US 6,955,241 B2
(45) Date of Patent: Oct. 18, 2005

(54) SPEAKER UNIT FOR LOW FREQUENCY REPRODUCTION

(75) Inventors: Erik Thorsell, San Pedro, CA (US); Glenn Cass, Lomita, CA (US); Tetsuya Oishi, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 11/041,822

(22) Filed: Jan. 24, 2005

(65) Prior Publication Data

US 2005/0145434 A1 Jul. 7, 2005

Related U.S. Application Data

(62) Division of application No. 09/714,799, filed on Nov. 16, 2000.

(51) Int. Cl.[7] .......................... H05K 5/02; H04R 1/02; H04R 1/22; H04R 1/28

(52) U.S. Cl. ..................... 181/156; 181/199; 381/349; 381/338

(58) Field of Search ............................... 181/156, 199, 181/148, 196; 381/345, 349, 350, 338

(56) References Cited

U.S. PATENT DOCUMENTS

| | | | | |
|---|---|---|---|---|
| 3,037,081 | A * | 5/1962 | Carlsson | 381/336 |
| 3,952,159 | A * | 4/1976 | Schott | 381/349 |
| 4,301,332 | A * | 11/1981 | Dusanek | 381/349 |
| 4,410,064 | A | 10/1983 | Taddeo | |
| 4,590,332 | A | 5/1986 | Delbuck | |
| 4,930,596 | A * | 6/1990 | Saiki et al. | 181/152 |
| 4,953,655 | A | 9/1990 | Furrukawa | |
| 5,004,066 | A | 4/1991 | Furukawa | |
| 5,010,977 | A * | 4/1991 | Furukawa et al. | 381/96 |
| 5,150,417 | A * | 9/1992 | Stahl | 381/349 |
| 5,173,575 | A * | 12/1992 | Furukawa | 381/96 |
| 5,333,204 | A * | 7/1994 | Hamada et al. | 381/346 |
| 5,590,208 | A * | 12/1996 | Koyano et al. | 381/338 |
| 5,710,395 | A * | 1/1998 | Wilke | 181/153 |
| 5,731,552 | A * | 3/1998 | Tsao | 181/156 |
| 6,114,751 | A | 11/2000 | Velandia | |
| 6,223,853 | B1 * | 5/2001 | Huon et al. | 181/145 |

(Continued)

FOREIGN PATENT DOCUMENTS

JP 04030698 A * 2/1992 ............ H04R 3/04

(Continued)

*Primary Examiner*—Edgardo San Martin
(74) *Attorney, Agent, or Firm*—Brinks Hofer Gilson & Lione

(57) ABSTRACT

The invention provides a speaker unit for low frequency reproduction wherein distortion is reduced and the orientation of a sound image of the lower side frequency region is augmented. To that end, the phase characteristic in an actually used frequency band is made substantially flat. The speaker unit includes a speaker enclosure, a duct formed in the speaker enclosure and having a port thereon, and a speaker mounted in the speaker enclosure. The speaker is formed such that it has a first resonance frequency set higher than a higher side frequency of the actually used frequency band (about 20 Hz to 100 Hz), while the port is formed such that it has a second resonance frequency set lower than a lower side frequency of the actually used frequency band. For example, the speaker includes a vibrating system having a reduced mass or a reduced compliance with which the first resonance frequency is set higher than the higher side frequency of the actually used frequency band, and the duct has an increased length or a controlled cross sectional area with which the second resonance frequency is set lower than the lower side frequency of the actually used frequency band.

19 Claims, 9 Drawing Sheets

SPEAKER UNIT FOR LOW-FREQUENCY REPRODUCTION OF THE INVENTION f-z, f-θ CHARACTERISTICS OF THE SPEAKER UNIT FOR LOW-FREQUENCY REPRODUCTION OF THE INVENTION

U.S. PATENT DOCUMENTS

| | | | | |
|---|---|---|---|---|
| 6,307,943 | B1 * | 10/2001 | Yamagishi | 381/312 |
| 6,389,146 | B1 | 5/2002 | Croft | |
| 6,513,624 | B2 * | 2/2003 | Coffin | 181/199 |
| 6,560,343 | B1 * | 5/2003 | Kim | 381/349 |

FOREIGN PATENT DOCUMENTS

| | | | | |
|---|---|---|---|---|
| JP | 05041896 A | * | 2/1993 | H04R 1/28 |

* cited by examiner

SPEAKER UNIT FOR LOW-FREQUENCY REPRODUCTION OF THE INVENTION f-z, f-θ CHARACTERISTICS OF THE SPEAKER UNIT FOR LOW-FREQUENCY REPRODUCTION OF THE INVENTION

CONSTRUCTION OF THE SPEAKER

CONSTRUCTION OF THE SPEAKER UNIT FOR LOW-FREQUENCY REPRODUCTION OF THE INVENTION

CONSTRUCTION OF A CONVENTIONAL SPEAKER UNIT FOR LOW-FREQUENCY REPRODUCTION

CHARACTERISTIC DIAGRAMS OF THE SPEAKER UNIT FOR LOW-FREQUENCY REPRODUCTION OF THE INVENTION

IMPEDANCE CHARACTERISTIC (f-z CHARACTERISTIC) OF THE INVENTION

PHASE CHARACTERISTIC (f-θ CHARACTERISTIC) OF THE INVENTION

CHARACTERISTIC DIAGRAMS OF A CONVENTIONAL SPEAKER UNIT FOR LOW-FREQUENCY REPRODUCTION

CONVENTIONAL SPEAKER UNIT FOR LOW-FREQUENCY REPRODUCTION OF THE PHASE INVERSION TYPE

ANOTHER CONVENTIONAL SPEAKER UNIT FOR LOW-FREQUENCY REPRODUCTION OF THE PHASE INVERSION TYPE f-z, f-θ CHARACTERISTICS OF A CONVENTIONAL SPEAKER UNIT FOR LOW-FREQUENCY REPRODUCTION

SCHEMATIC VIEW OF SPEAKER ARRANGEMENT

SPEAKER UNIT FOR LOW FREQUENCY REPRODUCTION

This application is a divisional application of co-pending, commonly assigned U.S. patent application Ser. No. 09/714,799, filed Nov. 16, 2000, the disclosure of which is incorporated by reference herein.

BACKGROUND OF THE INVENTION

1. Field of the Invention

This invention relates to a speaker unit for low frequency reproduction, and more particularly to a speaker unit for low frequency reproduction wherein a duct having a port (opening) formed thereon is provided in a speaker enclosure.

2. Description of the Related Art

Various speaker units for low frequency reproduction are conventionally known and include a speaker unit for low frequency reproduction of the phase inversion type as shown in a sectional view and a front elevational view in FIGS. 8(*a*) and (*b*), respectively. Referring to FIGS. 8(*a*) and 8(*b*), the speaker unit for low frequency reproduction of the phase inversion type shown includes a speaker 4 provided on an enclosure 3 in the form of a box in which a speaker opening 1 is formed. A duct (pipe) 5 having a port (opening) 2 is formed on a front wall of the enclosure 3. A sound absorbing material 6 is suitably disposed in the inside of the enclosure 3. In the speaker unit for low frequency reproduction of the phase inversion type having such a structure as just described, the enclosure (called Vented Type Enclosure) itself can be formed as a Helmholtz resonator and frequencies of the entire lower side frequency band can be reinforced. The reason is described below.

A speaker vibrates forwardly and backwardly to produce waves of compression and rarefaction in a space. When the speaker moves forwardly, the air in front of the cone becomes dense while the air in the rear of the cone becomes rarefied, and the phases of them are just opposite to each other. If the speaker is driven by itself without a baffle, then the compression and rarefaction conditions in the front and rear of the speaker mix with and cancel each other, and no sound is produced. In order to prevent sounds of the opposite phases in the front and rear of the cone from mixing with each other, a large baffle should be provided.

However, a baffle which is effective also with regard to low frequencies requires a corresponding large size and is not practical. Therefore, in a speaker unit for low frequency reproduction of the phase inversion type, the phase of sound from the rear of the cone is inverted by 180° by means of the duct 5 so that the sound may have the same phase as that of the sound in front of the cone, and the sound of the inverted phase is radiated from the port 2. In other words, the speaker unit for low frequency reproduction of the phase inversion type makes positive use of sound radiated from the rear face of the speaker in that a "Helmholtz resonance" action is generated by the internal volume of the enclosure 3 and the duct 5, and sound is radiated to the outside from the port 2 by the resonance action. Since the radiated sound has the same phase as that of sound radiated to the front of the speaker unit, it acts to augment the radiation efficiency just of low sound. The reason why the term "phase inversion" is used is that the enclosure makes positive use of the fact that sound of the reverse phase from the rear face of the speaker unit is converted into sound of the normal phase when it is radiated from the port upon resonance, and the resulting sound promotes the effect of the sound of the normal phase from the front face of the speaker unit.

FIG. 9 is a perspective view of another conventional speaker unit for low frequency reproduction of the phase inversion type. Referring to FIG. 9, in the speaker unit for low frequency reproduction of the phase inversion type shown, a speaker opening 1 and a port 2 are formed in different adjacent faces of an enclosure 3, and a duct 5 having a circular cross section is formed in the enclosure 3.

FIG. 10 is a diagram illustrating an electric impedance characteristic (f-Z characteristic) of a conventional speaker unit for low frequency reproduction of the phase inversion type. It can be seen from the f-Z characteristic illustrated in FIG. 10 that the speaker unit has a first resonance frequency (resonance frequency of the speaker 4 attached to the box) $f_1$ and a second resonance frequency (resonance frequency of the port 2) $f_2$ and has a resonance frequency $f_0$ between the first resonance frequency $f_1$ and the second resonance frequency $f_2$, and exhibits a high radiation efficiency in the proximity of the resonance frequency $f_0$.

FIG. 11 shows an example of an arrangement of speakers in an automobile of the sedan type. Referring to FIG. 11, four speakers $S_1$ to $S_4$ of the full range are disposed on the front and rear, left and right doors of the automobile, and in addition, a speaker $S_5$ for low frequency reproduction of the type described hereinabove with reference to FIG. 8 or 9 is disposed as a sub woofer in the trunk space. In a RV vehicle or an automobile of the mini van type, the speaker $S_5$ for low frequency reproduction is disposed at an end of a bulk storage space at a rear portion.

In a speaker unit for low frequency reproduction of the phase inversion type, the maximum sound pressure is obtained around the resonance frequency. Conventionally, a speaker unit for low frequency reproduction of the phase inversion type is designed such that the first and second resonance frequencies $f_1$ and $f_2$ (FIG. 10) may both have suitable values within an actually used band (about 20 Hz to 100 Hz). Since the electric impedance varies around the first and second resonance frequencies $f_1$ and $f_2$, the frequency phase characteristic (f-θ characteristic) is not flat at the phase=0 as seen from the broken line in FIG. 10. In other words, in a conventional speaker unit for low frequency reproduction, the phase θ is retarded or advanced in the actually used band, and a delay in time is generated depending upon the frequency f. Conventionally, it is desirable that sound arrives in a state of zero phase delay, and if the phase is retarded or advanced depending upon the frequency, then the sound becomes impure and distortion of the sound increases. Since particularly the sub woofer $S_5$ is disposed at a location farthest from the driver's seat in the automobile as shown in FIG. 11, the delay of the sound increases and a distortion in sound quality is generated by phase displacements from the main speakers $S_1$ to $S_4$. Further, a problem occurs that the orientation of a sound image of the sub woofer $S_5$ is deteriorated.

SUMMARY OF THE INVENTION

It is an object of the present invention to provide a speaker unit for low frequency reproduction wherein distortion is reduced and the orientation of a sound image of the lower side frequency region is augmented.

In order to attain the object described above, according to the present invention, the phase characteristic in the actually used frequency band is made substantially flat (=zero).

More particularly, according to the present invention, the object described above is achieved by a speaker unit for low frequency reproduction comprising a speaker enclosure, a duct formed in the speaker enclosure and having a port thereon, and a speaker mounted on the speaker enclosure, the speaker having a first resonance frequency set higher than a higher side frequency of an actually used frequency band, the port having a second resonance frequency set lower than a lower side frequency of the actually used frequency band.

Preferably, the speaker includes a vibrating system having a reduced mass with which the first resonance frequency is set higher than the higher side frequency of the actually used frequency band. Alternatively, the speaker may have a reduced compliance with which the first resonance frequency is set higher than the higher side frequency of the actually used frequency band.

Preferably, the duct has an increased length with which the second resonance frequency is set lower than the lower side frequency of the actually used frequency band. Alternatively, the duct may have a controlled cross sectional area with which the second resonance frequency is set lower than the lower side frequency of the actually used frequency band.

With the speaker unit for low frequency reproduction, since the first and second resonance frequencies of the speaker unit are set outside the actually used frequency band, the phase characteristic of the speaker unit within the actually used frequency band can be made substantially flat, and consequently, a phase delay and a time delay are eliminated. As a result, the distortion and so forth which are caused by a phase displacement from some other speaker unit concurrently used are reduced, and a time delay for each frequency is eliminated. Consequently, the orientation of a sound image in a low frequency region is augmented significantly and a clear orientation feeling can be obtained.

Further, with the speaker unit for low frequency reproduction, both of the phase characteristic and the frequency characteristic of the speaker unit in the actually used frequency band can be made substantially flat. Consequently, sound of a high power can be outputted using a speaker of a small size.

Furthermore, with the speaker unit for low frequency reproduction, since a speaker unit having a low compliance (having a small amplitude) can be used in order to implement the speaker unit, possible damage to the speaker unit by an excessively great amplitude of output sound in the low frequency band can be eliminated, and consequently, increased reliability can be achieved.

The above and other objects, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIG. 3(*b*) is a perspective view of a voice coil and a center pole/yoke of the speaker of FIG. 3(*a*);

DESCRIPTION OF THE PREFERRED EMBODIMENT

A. General Construction

Figure 1:
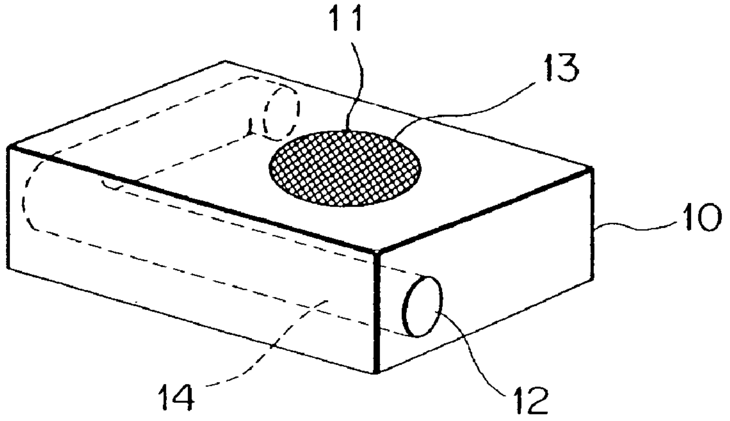
FIG. 1 is a schematic view of a speaker unit for low frequency reproduction to which the present invention is applied.

Referring to FIG. 1, there is shown a speaker unit for low frequency reproduction to which the present invention is applied. The speaker unit for low frequency reproduction includes an enclosure 10 having a speaker opening 11 and a port (opening) 12 formed in adjacent faces thereof. A speaker 13 is mounted in the inside of the enclosure 10 such that it is fitted in the speaker opening 11. Further, a duct (pipe) 14 which defines the port 12 extends substantially in an L shape in the inside of the enclosure 10.

Figure 2:
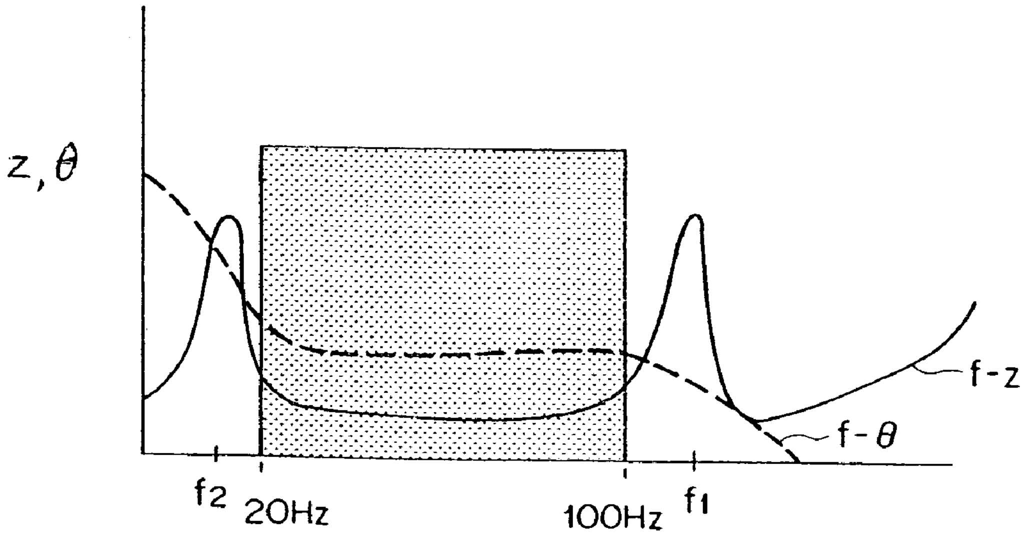
FIG. 2 is a diagram illustrating f-Z and f-θ characteristics of the speaker unit for low frequency reproduction shown in FIG. 1.

In the speaker unit for low frequency reproduction shown in FIG. 1, the speaker 13 and the duct 14 are designed such that the resonance frequency (first resonance frequency) $f_1$ of the speaker 13 when the speaker 13 is mounted in the enclosure 10 may be higher than a higher side frequency of an actually used frequency band (about 20 Hz to 100 Hz) and the resonance frequency (second resonance frequency) $f_2$ of the port 12 may be lower than a lower side frequency of the actually used frequency band. Where the speaker 13 and the duct 14 are designed such that the first and second resonance frequencies $f_1$ and $f_2$ may be outside the actually used frequency band (about 20 Hz to 100 Hz) in this manner, the electric impedance characteristic (f-Z characteristic) becomes as indicated by a solid line curve in FIG. 2, and the phase characteristic (f-θ characteristic) becomes substantially flat (=0) within the actually used frequency band as indicated by a broken line curve in FIG. 2.

B. Adjustment of the First and Second Resonance Frequencies

The resonance frequency (first resonance frequency) $f_1$ of the speaker 13 when the speaker 13 is mounted in the enclosure 10 can be determined in accordance with the following expression (1):

$$f_1=(1/2\pi)/(M\times C)^{1/2} \quad (1)$$

where M is the mass of the vibrating system of the speaker 13, and C is the compliance of the speaker 13. Accordingly, the first resonance frequency $f_1$ of the speaker unit can be set higher than the higher side frequency of the actually used frequency band (about 20 Hz to 100 Hz) by lowering the mass M or the compliance C of the vibrating system. Here, the compliance is an antonym of stiffness and is a value representative of a degree of readiness for vibrations.

Meanwhile, the resonance frequency (second resonance frequency) $f_2$ of the port 12 is determined in accordance with the following expression (2):

$$f_2=(V_S/2\pi)\times\{S/(L\times V_I)\}^{1/2} \quad (2)$$

where $V_S$ is the speed of sound, S is the sectional area of the duct 14, L is the length of the duct 14, and $V_I$ is the volume of the enclosure 10. Accordingly, the second resonance frequency $f_2$ can be set lower than the lower side frequency of the actually used frequency band (about 20 Hz to 100 Hz) by making the length L of the duct 14 formed integrally with the enclosure 10 longer than an ordinary length or by decreasing the sectional area S of the duct 14. In this instance, a decrease of the duct sectional area S increases the acoustic resistance, resulting in the possibility that the sound pressure may become insufficient. Therefore, the duct sectional area S cannot be made very small. Also an increase of the duct length decreases the sound pressure. Therefore, the duct length L and the duct sectional area S are preferably adjusted so that the sound pressure may not become very low and the second resonance frequency $f_2$ may become lower than the actual used frequency band.

C. Construction of the Speaker

C1. General Construction

Figure 3A:
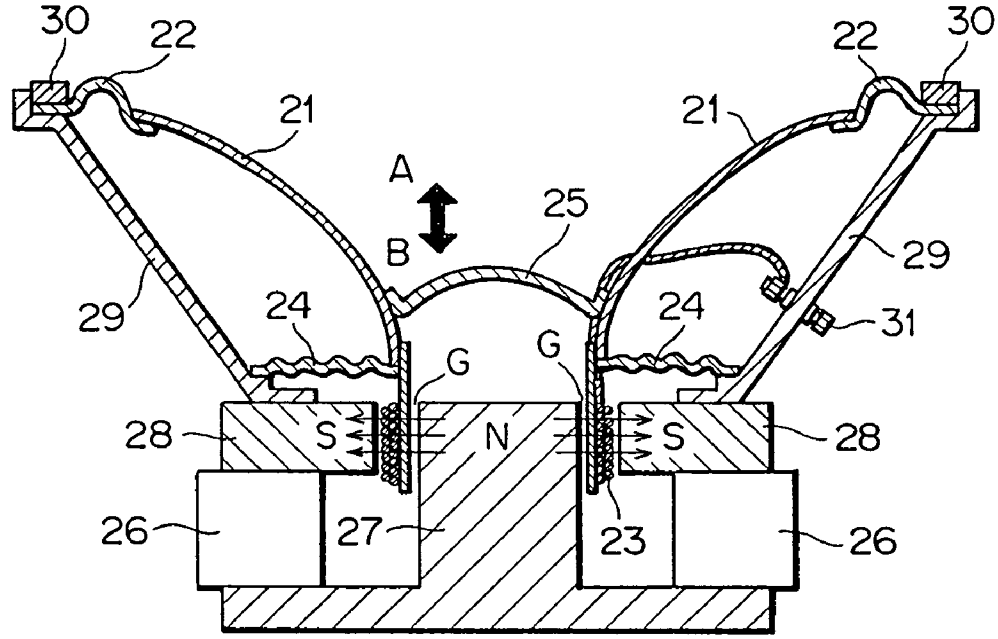
FIG. 3(*a*) is a schematic sectional view of a speaker.
Figure 3B:
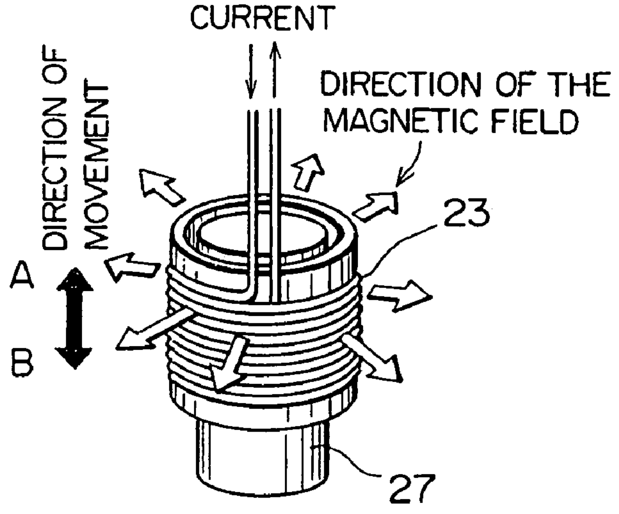

FIG. 3(*a*) is a schematic sectional view showing a construction of a very popular cone type speaker, which is divided into three main components. The first component is a vibrating system; the second component is a magnetic circuit; and the third component is a body section which supports the vibrating system and the magnetic circuit. Referring to FIG. 3(*a*), the vibrating system includes a diaphragm (paper cone) 21, an edge 22, a voice coil 23, a damper 24, a center cap 25, and so forth. The magnetic circuit includes a magnet 26, a center pole/yoke 27, and a plate 28. The body section includes a frame 29, a gasket 30, an input terminal 31, and so forth. If current is supplied to the voice coil 23 in accordance with a sound signal, then the paper cone 21 is vibrated in the direction of arrows A and B depending upon the direction of the current in accordance with Fleming's left-hand rule so that sound is radiated.

C2. Cone Diaphragm

The cone diaphragm 21 is characterized in that it has a conical shape (cone) and is a significant part which decides the speaker performance. For various intended objects and performances, cone diaphragms of various shapes made of various materials and produced by various production methods are available as the cone diaphragm 21. The cone diaphragm 21 is generally driven by the voice coil 23 secured to a neck portion thereof, and is supported at an outer periphery thereof by the edge 22. The cone diaphragm 21 is required to have a conical inclined face having an angle and a mechanical strength so that the outer periphery thereof far away from the driven point thereof may withstand the load of air.

As the material of the cone, paper pulp is used in most cases; aluminum and a material obtained by processing fibers of silk with a phenol resin or the like also are available. Recently, novel materials have been developed such as an aluminum single sheet and a honeycomb sandwich which uses a sandwich structure or a CFRP. A paper cone which is used most popularly as a cone has optimum values of physical performances as a diaphragm, that is, the rigidity, density and internal loss, and besides is easy to produce and has properties which cannot be readily achieved with other materials. As such paper cones, a laminated cone, a non-pressed cone, a wet pressed cone, a driveless cone and so forth are available, and they individually have characteristics. Also, many materials other than those mentioned above are available, and particularly where combinations, compounding ratios and so forth are taken into consideration, a great number of different materials are possible.

C3. Damper

The damper 24 has a function of holding the center of the voice coil 23 such that the voice coil 23 is suspended in the magnetic pole gap G and does not interfere with the magnetic poles when it vibrates, and another function of holding the position of the entire vibrating system. The stiffness of the holding of the damper 24 is a factor which dominates the low sound resonance frequency of the vibrating system. Accordingly, the damper 24 is required to have a structure and be made of a material which provide the damper 24 with a nature that it is flexible in the axial directions, which are vibrating directions, but is less likely to be moved by transverse vibrations perpendicular to the axial directions. An outside damper having corrugations generally called spider is made of a material principally of a hemp cloth, cotton, silk and nylon fibers and is in most cases produced by impregnating the material with a phenol resin and heating and shaping the same. This is because large eyes of cloths made of the materials mentioned provide the cloths with a gas permeability, which is effective to prevent internal resonance or radiation of sound.

C4. Edge

The edge 22 has a function as an acoustic termination of the diaphragm 21 and another function of holding the diaphragm 21 at its correct position to prevent acoustic short-circuiting which may possibly occur between a baffle plate and the outer periphery of the diaphragm 21. Therefore, the edge 22 is required to have mechanical linearity with respect to vibrations of the cone diaphragm 21. Further, since the edge 22 cooperates with the damper 24 to provide stiffness to the vibrating system and dominates the low sound resonance frequency, it is required to have a performance that it is flexible in the axial directions (the vibrating directions) but is less likely to be moved by transverse vibrations. Accordingly, attention must be paid to the structure and the material of the edge 22.

Structures for the edge are roughly divided into three types including a fixed edge structure, a free edge structure and an edgeless structure. From the point of view of a material for the edge, damping edges made of paper or cloth on which damping paint is coated, and edges for which leather (of deer, goat, rabbit or the like), felt, urethane foam, shaped rubber pieces and so forth are used are available. The edge 22 is desirably made of a material having a suitable acoustic resistance.

D. Detailed Adjustment of the First Resonance Frequency

In order to adjust the resonance frequency (first resonance frequency) $f_1$ of the speaker 13, from the expression (1) above, the mass M of the vibrating system should be reduced or the compliance C should be reduced. In order to reduce the mass M of the vibrating system, the materials of the diaphragm (paper cone) 21, edge 22, voice coil 23, damper 24, center cap 25 and so forth and materials to be impregnated into them should be devised so that they may have reduced weights.

Further, the damper and the edge act to provide stiffness to the vibrating system and dominate the low sound resonance frequency as described hereinabove. Accordingly, the compliance C can be reduced by suitably devising the materials and the structures of the damper and the edge. For example, a thick hemp cloth is used for the damper 24 and such a process as impregnation and hardening is performed for the damper 24 to increase the rigidity (spring constant).

Figure 4A:
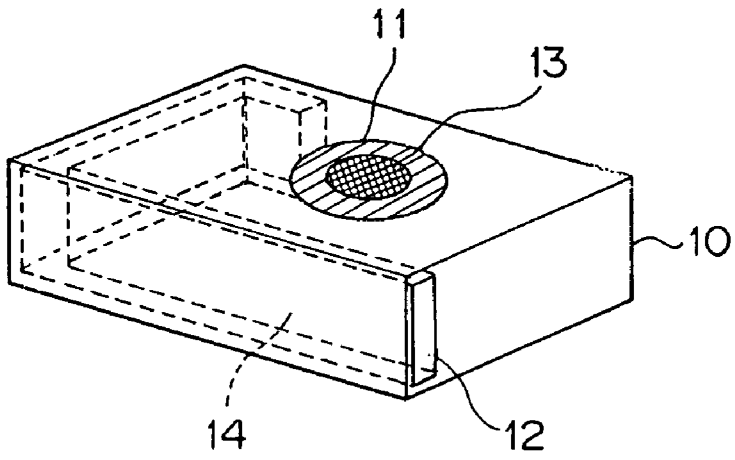
FIGS. 4(*a*), 4(*b*), and 4(*c*) are a perspective view, a top plan view, and a side elevational view, respectively, of a speaker unit for low frequency reproduction according to the present invention.
Figure 4B:
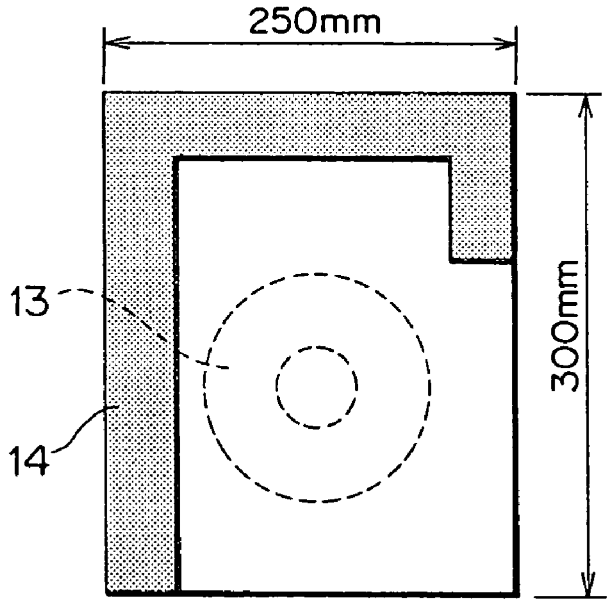
Figure 4C:
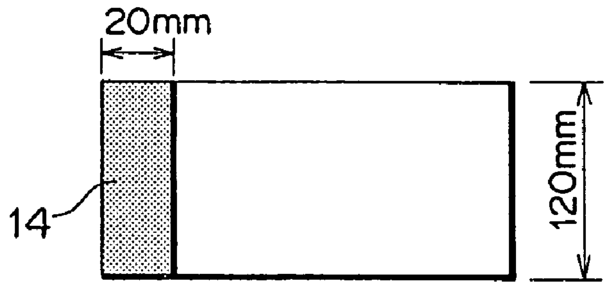
Figure 5A:
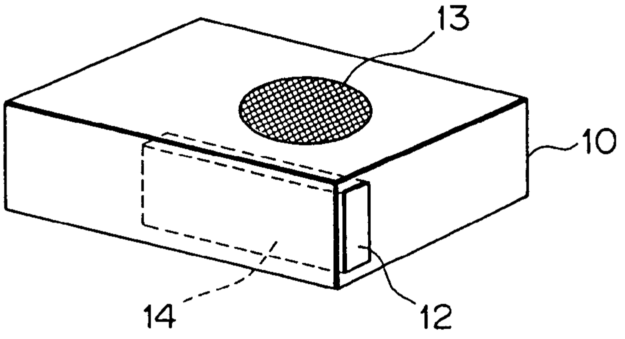
FIG. 5(a) PRIOR ART
FIGS. 5(*a*), 5(*b*), and 5(*c*) are a perspective view, a top plan view, and a side elevational view, respectively, of a conventional speaker unit for low frequency reproduction.
Figure 5B:
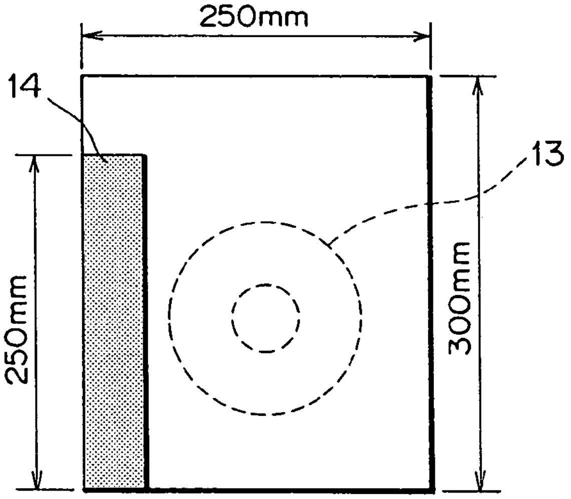
FIG. 5(b) PRIOR ART
Figure 5C:
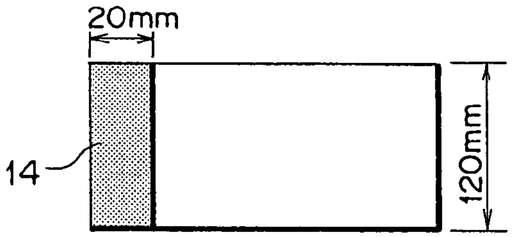
FIG. 5(c) PRIOR ART

E. Comparison in Construction and Characteristics between the Speaker Unit of the Invention and a Conventional Speaker Unit FIG. 4(*a*) shows a construction of the speaker unit for low frequency reproduction of the present invention and FIGS. 4(*b*) and 4(*c*) show the shape of the duct in the enclosure of the speaker unit for low frequency reproduction of FIG. 4(*a*) while FIG. 5(*a*) shows a construction of a conventional speaker unit for low frequency reproduction and FIGS. 5(*b*) and 5(*c*) show the shape of the duct in the enclosure of the speaker unit for low frequency reproduction of FIG. 5(*a*). In the speaker unit for low frequency reproduction of the present invention shown in FIGS. 4(*a*) to 4(*c*), the duct 14 is formed substantially in an L shape and is longer than the duct of the conventional speaker unit for low frequency reproduction shown in FIGS. 5(*a*) to 5(*c*).

Figure 6A:
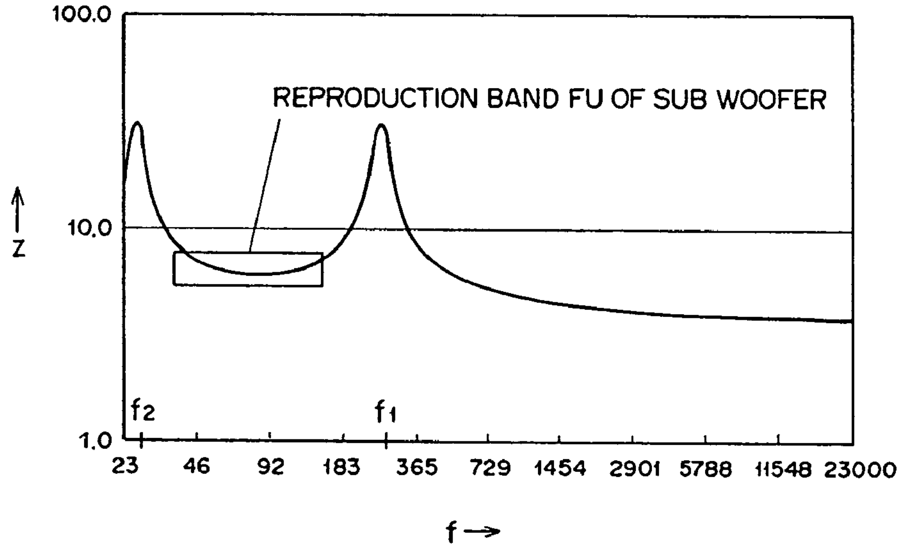
FIGS. 6(*a*) and 6(*b*) are diagrams illustrating an f-z characteristic and an f-θ characteristic of the speaker unit for low frequency reproduction shown in FIGS. 4(*a*) to 4(*c*)
Figure 6B:
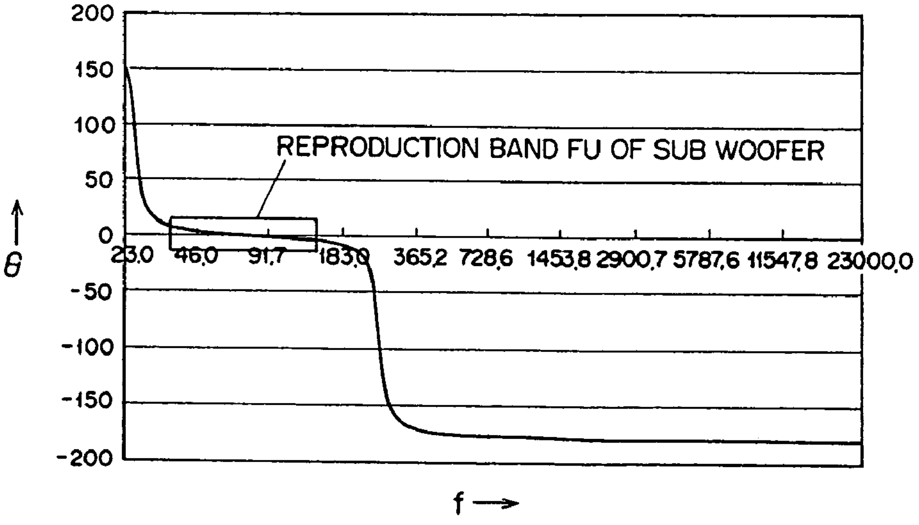
Figure 7A:
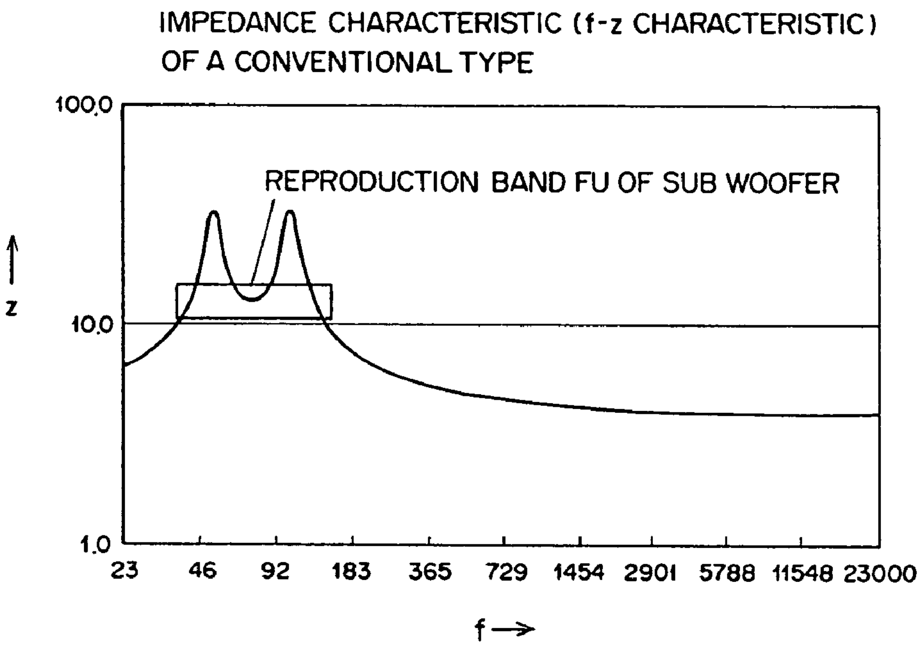
FIG. 7(a) PRIOR ART
FIGS. 7(*a*) and 7(*b*) are diagrams illustrating an f-z characteristic and an f-θ characteristic of the conventional speaker unit for low frequency reproduction shown in FIGS. 5(*a*) to 5(*c*)
Figure 7B:
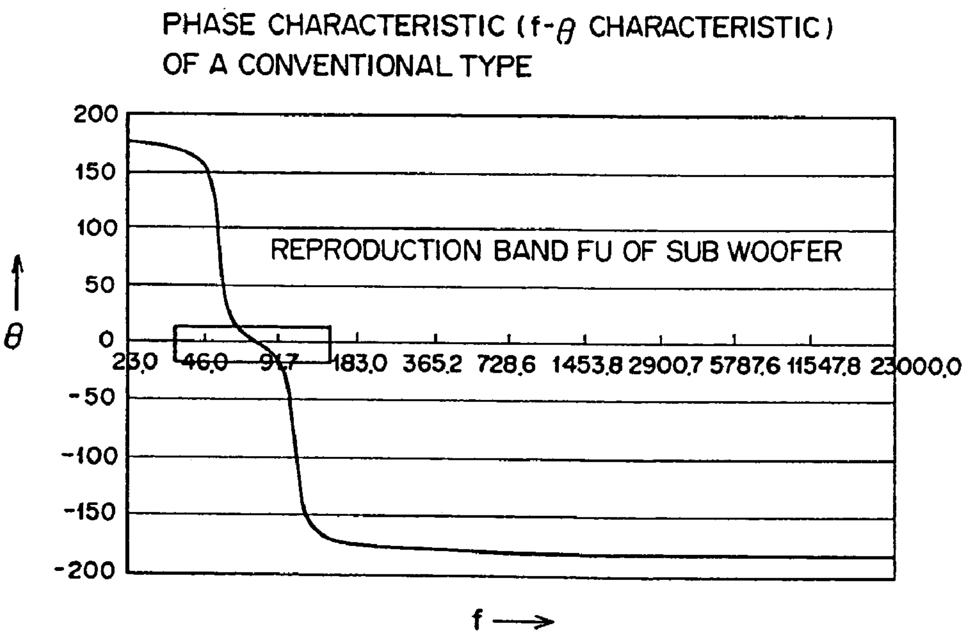
FIG. 7(b) PRIOR ART
Figure 8A:
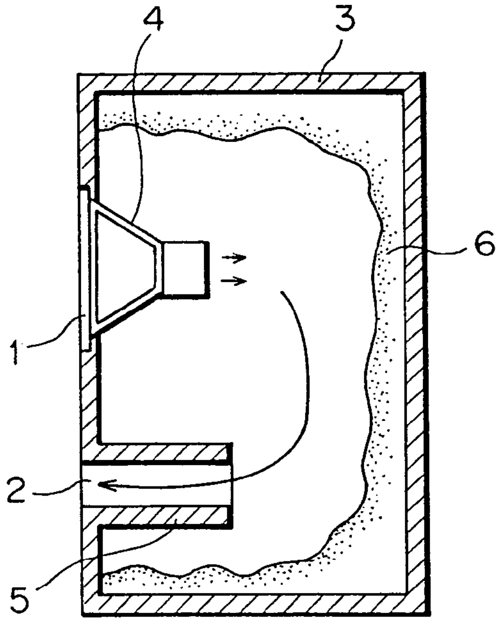
FIG. 8(a) PRIOR ART
FIGS. 8(*a*) and 8(*b*) are a schematic sectional view and a front elevational view, respectively, of a conventional speaker unit for low frequency reproduction of the phase inversion type.
Figure 8B:
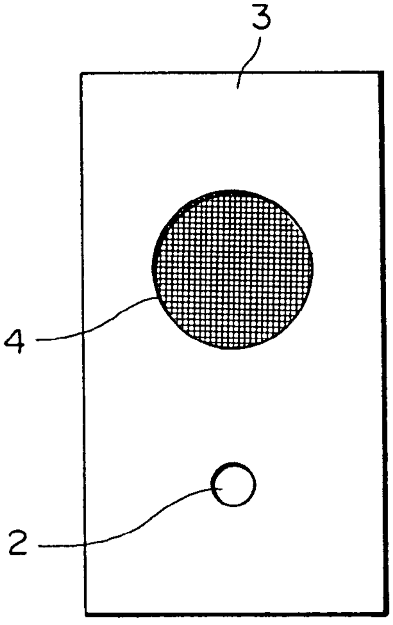
FIG. 8(b) PRIOR ART
Figure 9:
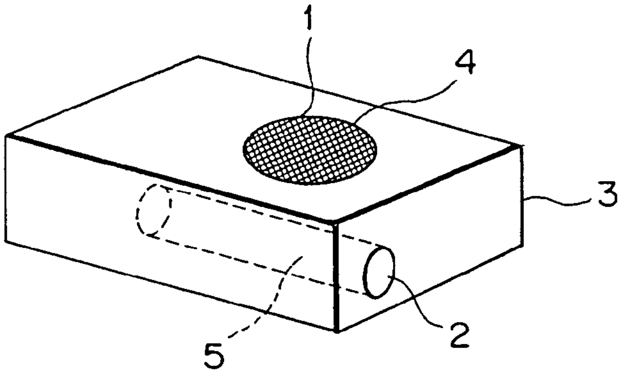
FIG. 9 PRIOR ART
FIG. 9 is a perspective view of another conventional speaker unit for low frequency reproduction of the phase inversion type.
Figure 10:
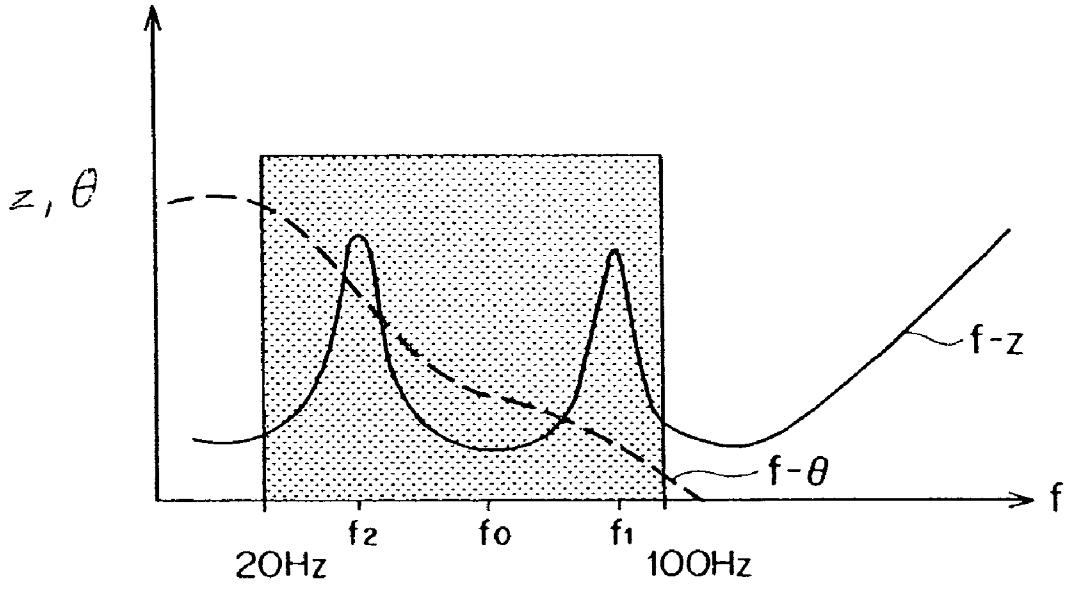
FIG. 10 PRIOR ART
FIG. 10 is a diagram illustrating f-Z and f-θ characteristics diagram of a conventional speaker unit for low frequency reproduction.
Figure 11:
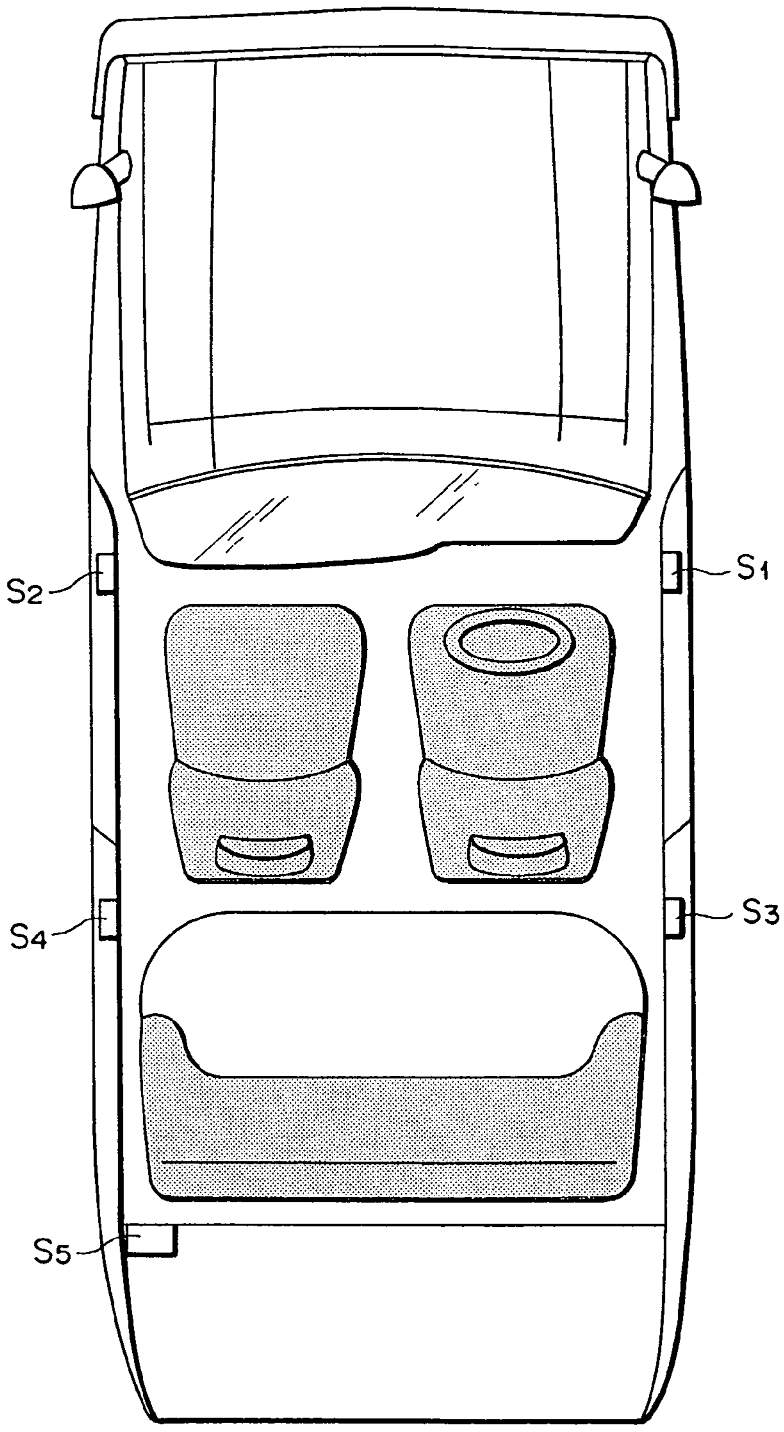
FIG. 11 PRIOR ART
FIG. 11 is a schematic view showing an arrangement of speakers in an automobile.

FIGS. 6(*a*) and 6(*b*) illustrate the f-Z characteristic and the f-θ characteristic of the speaker unit for low frequency reproduction of the present invention, and FIGS. 7(*a*) and 7(*b*) illustrate the f-Z characteristic and the f-θ characteristic of the conventional speaker unit for low frequency reproduction. As can be seen from FIGS. 6(*a*) and 6(*b*), with the speaker unit for low frequency reproduction of the present invention, the first and second resonance frequencies $f_1$ and $f_2$ can be set such that they can be outside the actually used frequency band (sub woofer frequency band) FU and the f-θ characteristic can be made substantially flat (=0) within the actually used frequency band. In contrast, with the conventional speaker unit for low frequency reproduction, the first and second resonance frequencies $f_1$ and $f_2$ are both included in the actually used frequency band (sub woofer frequency band) FU, and consequently, the f-θ characteristic does not become flat but exhibits a great variation within the actually used frequency band.

While a preferred embodiment of the present invention has been described using specific terms, such description is for illustrative purposes only, and it is to be understood that changes and variations may be made without departing from the spirit or scope of the following claims.

What is claimed is:

1. A speaker unit for low frequency reproduction in a predetermined actually used frequency band, comprising:

a speaker enclosure;

a duct formed in said speaker enclosure and having a port thereon; and a speaker mounted in said speaker enclosure;

said speaker having a first resonance frequency set higher than a higher side frequency of the actually used frequency band and said port having a second resonance frequency set lower than a lower side frequency of the actually used frequency band, so that the phase characteristic of the speaker unit is substantially zero within the actually used frequency band.

2. A speaker unit for low frequency reproduction according to claim 1, wherein the actually used frequency band ranges from about 20 Hz to 100 Hz.

3. A speaker unit for low frequency reproduction according to claim 1, wherein said speaker includes a vibrating system having a reduced mass with which the first resonance frequency is set higher than the higher side frequency of the actually used frequency band.

4. A speaker unit for low frequency reproduction according to claim 3, wherein said speaker includes a diaphragm having a reduced mass with which the first resonance frequency is set higher than the higher side frequency of the actually used frequency band.

5. A speaker unit for low frequency reproduction according to claim 3, wherein said speaker includes an edge having a reduced mass with which the first resonance frequency is set higher than the higher side frequency of the actually used frequency band.

6. A speaker unit for low frequency reproduction according to claim 3, wherein said speaker includes a voice coil having a reduced mass with which the first resonance frequency is set higher than the higher side frequency of the actually used frequency band.

7. A speaker unit for low frequency reproduction according to claim 3, wherein said speaker includes a damper having a reduced mass with which the first resonance frequency is set higher than the higher side frequency of the actually used frequency band.

8. A speaker unit for low frequency reproduction according to claim 3, wherein said speaker includes a center cap having a reduced mass with which the first resonance frequency is set higher than the higher side frequency of the actually used frequency band.

9. A speaker unit for low frequency reproduction according to claim 1, wherein said speaker has a reduced compliance with which the first resonance frequency is set higher than the higher side frequency of the actually used frequency band.

10. A speaker unit for low frequency reproduction according to claim 9, wherein said speaker has a damper structure or is made of a material determined so that said speaker has the reduced compliance.

11. A speaker unit for low frequency reproduction according to claim 9, wherein said speaker has an edge structure determined so that said speaker has the reduced compliance.

12. A speaker unit for low frequency reproduction according to claim 10, wherein said damper has a structure or is made of a material which provides said damper with a nature so that said damper is flexible in the vibrating directions but is less likely to be moved as transverse vibrations.

13. A speaker unit for low frequency reproduction according to claim 10, wherein said damper is made of a thick hemp cloth.

14. A speaker unit for low frequency reproduction according to claim 10, wherein said damper is produced by a process including impregnation and hardening.

15. A speaker unit for low frequency reproduction according to claim 11, wherein said edge has a structure or is made of a material which provides said edge with a nature so that said edge is flexible in the vibrating directions but is less likely to be moved as transverse vibrations.

16. A speaker unit for low frequency reproduction according to claim 1 or 2, wherein said duct has an increased length with which the second resonance frequency is set lower than the lower side frequency of the actually used frequency band.

17. A speaker unit for low frequency reproduction according to claim 16, wherein said duct extends in a substantially L shape in said enclosure.

18. A speaker unit for low frequency reproduction according to claim 1 or 2, wherein said duct has a controlled cross sectional area with which the second resonance frequency is set lower than the lower side frequency of the actually used frequency band.

19. A speaker unit for low frequency reproduction, comprising:

a speaker enclosure;

a speaker mounted in said speaker enclosure; and a duct provided in said speaker enclosure and having a port at one end thereof communicating with an opening formed in a face of said speaker enclosure;

wherein the phase characteristic is substantially zero in a frequency band from about 20 Hz to about 100 Hz by setting a first resonance frequency of the speaker higher than about 100 Hz and setting a second resonance frequency of the port lower than about 20 Hz.

* * * * *